United States Patent [19]

Nelson

[11] Patent Number: 4,632,727
[45] Date of Patent: Dec. 30, 1986

[54] COPPER ETCHING PROCESS AND SOLUTION

[75] Inventor: Norvell J. Nelson, Palo Alto, Calif.

[73] Assignee: Psi Star, Hayward, Calif.

[21] Appl. No.: 764,582

[22] Filed: Aug. 12, 1985

[51] Int. Cl.$^4$ ............................ C23F 1/02; B44C 1/22; C03C 15/00; C03C 25/06

[52] U.S. Cl. .................... 156/656; 156/659.1; 156/666; 156/902; 252/79.2; 252/79.4

[58] Field of Search ................. 156/642, 656, 659.1, 156/666, 901, 902; 252/79.2, 79.4, 142, 146; 134/3, 41

[56] References Cited

U.S. PATENT DOCUMENTS

| | | |
|---|---|---|
| 3,367,874 | 2/1968 | Haviland et al. ............... 252/79.4 X |
| 3,702,273 | 11/1972 | Johnston et al. ............... 252/79.4 X |
| 4,497,687 | 2/1985 | Nelson ........................... 252/79.2 X |
| 4,545,850 | 10/1985 | Nelson ........................... 156/642 |

FOREIGN PATENT DOCUMENTS 0514912 10/1976 U.S.S.R. ............................ 252/79.4

Primary Examiner—William A. Powell
Attorney, Agent, or Firm—Flehr, Hohbach, Test, Albritton & Herbert

[57] ABSTRACT

Process and solution for etching copper, for example, to remove it from printed circuit boards. The etching is effected by an aqueous solution of nitric acid, a polymer which inhibits undercutting of the copper, a surfactant, and sulfuric acid and/or an alkane sulfonic acid such as methane sulfonic acid.

10 Claims, No Drawings

COPPER ETCHING PROCESS AND SOLUTION

This invention pertains generally to the etching of metals, and more particularly to a process and solution for etching copper in the manufacture of printed circuit boards.

U.S. Pat. No. 4,497,687 describes a process for etching copper and other metals with an aqueous solution of nitric acid, and U.S. Pat. No. 4,545,850 (Ser. No. 642,150, filed Aug. 20, 1984) describes a similar process in which the etching solution is regenerated as the material is removed. In each of these processes, copper nitrate or another copper salt is employed in the etching solution as a background electrolyte. The copper salt permits a high reactivity towards copper without making the solution so acidic that it is also reactive toward organic etch resists and substrate materials.

With the copper nitrate electrolyte, some difficulty has been encountered when solder and other metals are utilized as an etch resist to protect portions of the copper foil to be retained on a circuit board. If the etching solution is reactive toward the resist material, some of the resist material may be removed with the copper in a somewhat unpredictable and uncontrollable manner.

It is in general an object of the invention to provide a new and improved process and solution for etching copper.

Another object of the invention is to provide a process and solution of the above character which are particularly suitable for removing copper from printed circuit boards where portions of the copper to be retained are protected by solder or other metal etch resists.

These and other objects are achieved in accordance with the invention by contacting the copper with an aqueous solution of nitric acid, a polymer which inhibits undercutting of the copper, a surfactant, and an additional acid selected from the group consisting of sulfuric acid, an alkane sulfonic acid such as methane sulfonic acid, and combinations thereof.

It has been found that the etching process and solution of the invention produce essentially the same desirable results as a copper nitrate based solution with respect to gross reaction characteristics such as speed, etch residues and handling. In addition, the new process and solution are more tolerant toward metal etch resists, particularly solder.

An etching solution using sulfuric acid has a lower capacity for carrying copper than a solution with copper nitrate, and this reduces the amount of dissolved copper in the dragout. This, in turn, reduces the demand for wastewater treatment. The remaining copper precipitates out as sulfate pentahydrate as the solution cools and is easily removed.

With the lower copper carrying capacity of sulfuric acid solutions, there is a tendency for copper crystallites to precipitate onto the surface of the circuit boards as the etching solution approaches saturation. If desired, this tendency can be avoided by using an alkane sulfonic acid in place or in combination with the sulfuric acid. Suitable alkane sulfonic acids include methane sulfonic acid and other sulfonic acids of alkanes having no more than about four carbon atoms per molecule. The copper salt of the sulfonic acid is considerably more soluble than the sulfate, thus reducing the tendency to form crystallites. The acid strength of alkane sulfonic acids is equivalent to that of sulfuric acid, and the acids are readily interchangeable in this application. The alkane sulfonic acid is not consumed in the etching process, and after the initial charge, it only needs to be added to replenish any dropout losses.

The process is regenerative in that the etching solution is replenished by the addition of nitric acid and sulfuric acid as the etching progresses. The regeneration is discussed more fully in U.S. Pat. No. 4,545,850, (Ser. No. 642,150, filed Aug. 20, 1984).

The use of sulfuric acid and methane sulfonic acid in an aqueous process for etching copper is illustrated by the following examples.

EXAMPLE 1

A copper etch solution having the following formulation was mixed together and heated to 45° C. before use.

1500 cc Deionized Water
400 cc Sulfuric Acid (100%)
600 cc Nitric Acid (70%)
100 cc Phosphoric Acid (85%)
100 cc 2% Solution of Separan CP-7HS (a Dow Chemical polyacrylamide)
1 cc Zonyl FSC (a DuPont surfactant)

This solution was used to etch a ¼ oz sample of copper foil having a plated-up pattern defined by a tin etch resist. The sample was cleanly and uniformly etched in 37 seconds. The pattern defined by the tin etch resist remained. A cross-section of this pattern showed that the etch produced lines had straight sidewalls and that the tin etch resist was not undercut.

EXAMPLE 2

An etch solution having the following composition was mixed and heated to 45° C. before use.

1100 cc Deionized Water
800 cc Methane Sulfonic Acid (70%)
200 cc Sulfuric Acid (100%)
900 cc Nitric Acid (70%)
100 cc Phosphoric Acid (85%)
100 cc 2% Solution of Reten 520 (a Hercules polyacrylamide)
5 cc Varion H.C. (a Sherex Chemical surfactant)

This solution was used to etch a number of samples having plated-up copper patterns defined by either a tin or a solder etch resist. A sample having a tin defined pattern on ⅜ oz foil was cleanly and uniformly etched in 28 seconds; a similar sample with ½ oz foil was etched in 32 seconds. A sample with a solder pattern on ¼ oz foil was cleanly and uniformly etched in 24 seconds; a similar sample having a tin pattern was etched in 20 seconds. Cross-sectioning this latter sample showed that the etched structures had straight sidewalls with minimal undercut.

EXAMPLE 3

An etch solution with the following formulation was mixed and heated to 45° C. before use.

1100 cc Deionized Water
1000 cc Methane Sulfonic Acid (70%)
900 cc Nitric Acid (70%)
100 cc 2% Solution of Reten 520 (a Hercules polyacrylamide)
5 cc Varion H.C. (a Sherex Chemical surfactant)

This solution was used to etch a sample having a plated-up pattern defined by a thin etch resist. The sample was etched cleanly and uniformly in 35 seconds. A cross-section of the etched pattern showed that the etched structures had straight sidewalls with minimum undercut.

From these examples, it can be seen that the etching solution with sulfuric acid and/or an alkane sulfonic acid maintain the desirable etch characteristics of the copper nitrate based process described in U.S. Pat. No. 4,497,687. In addition, the sulfuric/sulfonic acid based process is much more tolerant toward metal etch resists such as solder.

It is apparent from the foregoing that a new and improved process and solution for etching copper have been provided. While only certain presently preferred embodiments have been described in detail, as will be apparent to those familiar with the art, certain changes and modifications can be made without departing from the scope of the invention as defined by the following claims.

I claim:

1. In a process for etching copper: contacting the copper with an aqueous solution of nitric acid, a polymer, a surfactant, and a sulfonic acid of an alkane having no more than four carbon atoms per molecule.

2. The process of claim 1 wherein the sulfonic acid comprises methane sulfonic acid.

3. An aqueous solution for etching copper, containing nitric acid, a polymer, a surfactant, and an additional acid selected from the group consisting of sulfuric acid, a sulfonic acid of an alkane having no more than four carbon atoms per molecule and combinations thereof, the amounts of nitric acid and the additional acid in the solution being approximately equal.

4. The solution of claim 3 wherein the sulfonic acid comprises methane sulfonic acid.

5. In a process for removing copper from a circuit board substrate with an etch resistant metal covering a portion of the copper to be retained: contacting the copper with an aqueous solution containing approximately equal amounts of nitric acid and sulfuric acid, a polymer which inhibits undercutting of the copper, and a surfactant.

6. In a process for removing copper from a circuit board substrate with an etch resistant metal covering a portion of the copper to be retained: contacting the copper with an aqueous solution of nitric acid, sulfuric acid, a sulfonic acid having no more than four carbon atoms per molecule, a polymer which inhibits undercutting of the copper, and a surfactant.

7. The process of claim 6 wherein the sulfonic acid comprises methane sulfonic acid.

8. In a process for removing copper from a circuit board substrate with an etch resistant metal covering a portion of the copper to be retained: contacting the copper with an aqueous solution of nitric acid, a sulfonic acid having no more than four carbon atoms per molecule, a polymer which inhibits undercutting of the copper, and a surfactant.

9. The process of claim 8 wherein the sulfonic acid comprises methane sulfonic acid.

10. In a process of etching copper: contacting the copper with an aqueous solution containing approximately equal amounts of nitric acid and sulfuric acid, a polymer and a surfactant.

* * * * *